United States Patent

Nakata et al.

[15] 3,671,821

[45] June 20, 1972

[54] SEMICONDUCTOR CONTROLLED RECTIFIER INCLUDING TWO EMITTER REGIONS

[72] Inventors: Josuke Nakata; Ryuji Denda, both of Itami, Hyogo Prefecture, Japan

[73] Assignee: Mitsubishi Denki Kabushiki Kaisha, Tokyo, Japan

[22] Filed: May 28, 1971

[21] Appl. No.: 147,909

[30] Foreign Application Priority Data

June 2, 1970 Japan....................................45/47392

[52] U.S. Cl................................................317/235, 317/234

[51] Int. Cl............................................................H01l 9/12

[58] Field of Search.............................317/234 AB, 235 AM

[56] References Cited

UNITED STATES PATENTS 3,124,703 3/1964 Sylvan.............................317/235 AB 3,284,681 11/1966 Gentry.............................317/235 AB 3,337,782 8/1967 Todaro, Jr......................317/235 AM 3,337,783 8/1967 Stehney...........................317/235 AB 3,579,060 5/1971 Davis..............................317/235 AB

*Primary Examiner*—James D. Kallam

*Attorney*—Robert E. Burns

[57] ABSTRACT

A semiconductor controlled rectifier is provided on its main surface having a gate electrode with first and second emitter layers separated from one another by a common base layer. The second emitter layer is disposed between the first emitter layer and the gate electrode. The device further comprises a high impurity concentration semiconductor layer of the opposite semiconductivity type to that of the second emitter layer. The high impurity concentration layer is disposed between the first and second emitter layers and adjacent to the second emitter layer.

4 Claims, 5 Drawing Figures

SEMICONDUCTOR CONTROLLED RECTIFIER INCLUDING TWO EMITTER REGIONS

BACKGROUND OF THE INVENTION

1. Field of the Invention

This invention relates to a semiconductor controlled rectifier of which adjacent semiconductor layers exhibit different conductivity type from one another, and more particularly, to an improved multi-layer structure of a semiconductor controlled rectifier high in the allowable initial rate of rise of forward current or in the *di/dt* capability and small in the required control electrical power.

2. Description of the Prior Art

Recently, the blocking voltage and the current capacity of semiconductor controlled rectifiers or of thyristors are improved, and it is desired to provide a semiconductor controlled rectifier high in the allowable initial rate of rise of forward current or high in the *di/dt* capability from the view point of the practical use of the thyristor. It is also desirable that a semiconductor controlled rectifier be small in the required control electrical power in view of the simultaneous use of pluralities of the thyristors.

In order to satisfy both the above-mentioned requirements, there has been proposed a semiconductor controlled rectifier with an auxiliary thyristor as illustrated in FIG. 1.

In FIG. 1, wherein a typical semiconductor controlled rectifier generally designated by the reference character B of the conventional design is illustrated, the reference numeral 1 is an N type semiconductor base layer of high specific resistance, 2 and 3 P type semiconductor layers of low specific resistance formed through the diffusion method for example, 4 and 5 annular N type semiconductor layers of high impurity concentration (low specific resistance) for forming a first and a second emitter layer respectively, 6 a metallic anode electrode, 7 a metallic cathode electrode, 8 an annular metallic layer of deposited aluminum, and 9 is a metal gate electrode formed by the evaporation or alloying method.

With such an arrangement, when the anode electrode 6 and the gate electrode 9 are positively biased with respect to the cathode electrode 7 by a suitable external circuit (not shown), a gate current flows through the electrical path composed of the gate electrode 9 — the P type semiconductor layer 3 — the N type semiconductor layer 5 — the metallic layer 8 — the P type semiconductor layer 3 — the N type semiconductor layer 4 — the cathode electrode 7. At that time, electrons are injected from the N type semiconductor layer 5 into the P type semiconductor layer 3, thereby to bring an auxiliary thyristor composed of the semiconductor layers 2, 1, 3 and 5 into the conductive state.

This conduction of the auxiliary thyristor causes a current to flow through an electrical path composed of the P type emitter layer 2 — the N type base layer 1 — the P type base layer 3 — the N type second emitter layer 5 — the metallic layer 8 — the P type layer 3 — the N type first emitter layer 4 — the cathode electrode 7. This current also serves as a gate current for a main thyristor, which is composed of the P type emitter layer 2 — the N type base layer 1 — the P type base layer 3 — the N type first emitter layer 4, thereby to turn ON the main thyristor.

The semiconductor controlled rectifier should be so arranged that an electrical resistance between the layers 4 and 5 is of an appropriate value, thereby to permit a forward current of an appropriate magnitude, which does not cause the auxiliary thyristor through which the current flows to be deteriorated and is of several ten amperes, to flow through the auxiliary thyristor. This enables the large initial conducting area of the main thyristor, whereby a high *di/dt* capability and a low control electrical power are realized.

In the conventional thyristor of the type that has heretofore been described, a very accurate positioning of the annular metallic layer 8 and the annular N type semiconductor layer 5 has been required. More specifically, the centers of both the annular metallic layer 8 and the annular N type semiconductor layer 5 have been required to be exactly in coincidence with one another. If these two centers are not in coincidence by only a slight amount, the electrical resistance between the layers 4 and 5 exhibits different values in accordance with the location at which the resistance is measured, resulting in the deterioration of the main thyristor due to the concentration of the forward current flowing through the main thyristor, and resulting in the decrease in the *di/dt* capability derived from the current concentration occurring at that portion of the main thyristor initially conducting at a particular small area.

In order to eliminate the above-described disadvantages of the conventional thyristor, a photoengraving process has been used. Therefore, the manufacturing process additionally includes one step including the mask aligning operation and another step of etching to separate the electrodes 7, 8 and 9. Since these processes are extremely complex and difficult, it is desired to omit these processes. In addition, in the conventional thyristor of the above type, the electrical resistance between the layers 4 and 5 increases with the increase in temperature of the element because the layer 3 has a surface impurity concentration of about $10^{18}$ atoms/cm$^3$. Therefore, the forward current flowing through the fired auxiliary thyristor decreases as the temperature of the element increases. Such thyristor is disadvantageous in that the *di/dt* capability of the main thyristor reduces in proportion to the elevation of the temperature of the element.

SUMMARY OF THE INVENTION

Accordingly, an object of the present invention is to provide a new and improved semiconductor controlled rectifier capable of turning on the main thyristor with large triggering current with a small gating current.

Another object of the invention is to provide a semiconductor controlled rectifier high in the allowable initial rate of rise of the forward current with respect to time or the *di/dt* capability upon switching.

Still another object of the invention is to provide a semiconductor controlled rectifier small in dispersion in the *di/dt* capability and capable of being easily fabricated.

A further object of the invention is to provide a semiconductor controlled rectifier free from the influence of temperature an the *di/dt* capability of the main thyristor.

According to the present invention, the above objects are achieved by the provision of a semiconductor controlled rectifier comprising a semiconductor wafer including a base layer of one semiconductivity type, a layer of the other semiconductivity type and a layer of said one semiconductivity type, a control electrode disposed on said base layer of said semiconductor wafer, a first emitter layer of said other semiconductivity type adjacent to said base layer, a second emitter layer of said other semiconductivity type formed adjacent to said base layer between said control electrode and said first emitter layer, and a layer of said one semiconductivity type formed between said first and second emitter layers and adjacent to said second emitter layer.

Said layer of said one semiconductivity type formed between said first and second emitter layers and adjacent to said second emitter layer may have an impurity concentration higher than that of the adjacent base layer. The surface impurity concentration of said layer of said one semiconductivity type formed between said first and second emitter layers and adjacent to said second emitter layer may be equal to or higher than $5 \times 10^{19}$ atoms/cm$^3$. This layer of said one semiconductivity type may be formed through the selective-diffusion method.

The semiconductor controlled rectifier may be subjected to the diffusion of gold from the main surface at a section including said layer of said one semiconductivity type formed between said first and second emitter layers and adjacent to said second emitter layer and said second emitter layer. Said diffusion of gold may preferably be carried out at a temperature of from 780° C to 800° C for from 2 to 10 minutes.

BRIEF DESCRIPTION OF THE DRAWING

The invention will become more readily apparent from the following detailed description taken in conjunction with the accompanying drawing in which.

Throughout the several Figures like reference characters designate identical or corresponding components.

DESCRIPTION OF THE PREFERRED EMBODIMENTS

Figure 1:
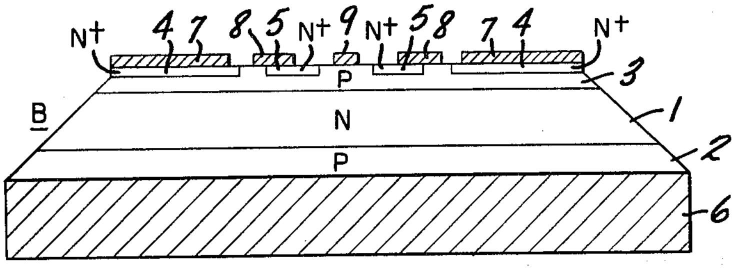
FIG. 1 PRIOR ART
FIG. 1 is a sectional view for illustrating a typical conventional semiconductor controlled rectifier.
Figure 2:
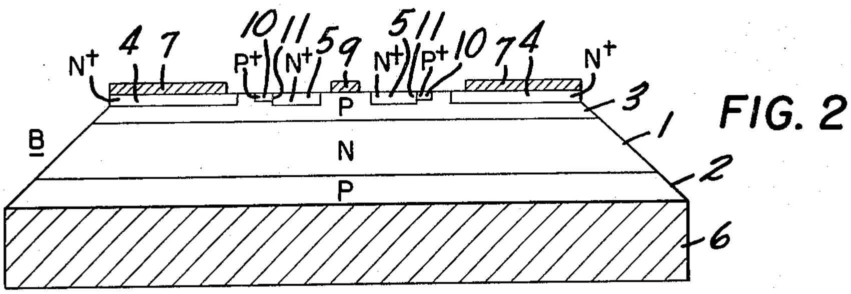
FIG. 2 is a sectional view for illustrating one example of a semiconductor controlled rectifier constructed in accordance with the present invention.
Figure 3:
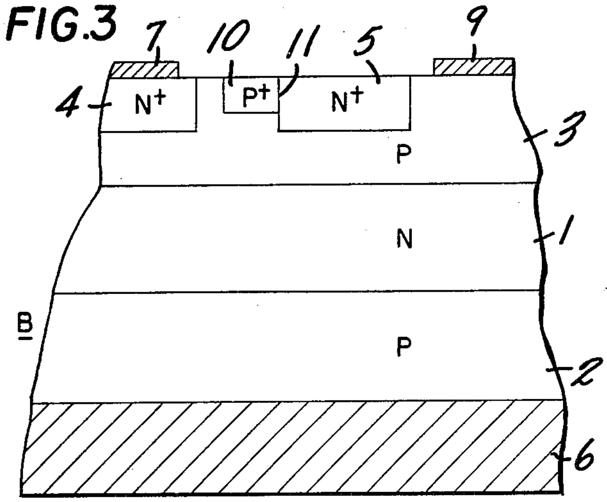
FIG. 3 is a fragmental enlarged sectional view for showing one part of the device shown in FIG. 2.
Figure 4:
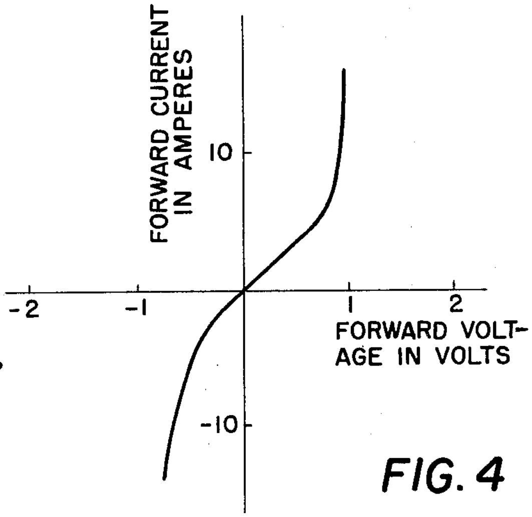
FIG. 4 is a graph for showing the current-to-voltage characteristic at the P-N junction of the element shown in FIG. 2.

Referring now to the drawing and in particular to FIGS. 2 and 3 wherein one embodiment of the present invention is illustrated in section, it is seen that the semiconductor structure shown in FIG. 2 is of the identical structure to the conventional one illustrated in FIG. 1 except that the device of the present invention does not have the metallic layer 8 shown in FIG. 1 and, instead thereof, the semiconductor controlled rectifier of the invention comprises an annular P type semiconductive layer 10 disposed adjacent to the outer periphery of the annular N type semiconductor layer 5. The semiconductor layer 10 is of high impurity concentration formed through the selective diffusion technique, for example, thereby to form a P-N junction 11 between the outer periphery of the annular N type semiconductor layer 5 and the inner periphery of the annular P type semiconductor layer 10. The current-to-voltage characteristic of the P-N junction 11 between the annular layers 5 and 10 is shown in FIG. 4, from which it is seen that the reverse resistance across the P-N junction 11 in the direction of from the N type layer 5 to the P type layer 10 is greatly reduced as compared with that without the layer 10 which exhibit a reverse resistivity of almost infinity.

One example of the process for fabricating the thyristor as above-described will now be described. A semiconductor wafer prepared from an N type semiconductor material of high specific resistance, which will remain in the completed semiconductor device as the N type semiconductor layer 1, is subjected to the diffusion of gallium from both the main surfaces of the semiconductor wafer, for example, at a temperature of 1,250° C for 30 hours to form P type semiconductor layers 2 and 3 in the upper and the bottom surfaces of the wafer respectively. Then, as is well known, phosphorus is selectively diffused on the surface of the P type layer 3 through the use of the silicondioxide mask to form the N type semiconductor layers 4 and 5 which serve as the first and second emitter regions respectively. Thereafter, through the use of the silicondioxide mask formed on the main surfaces, an elemental boron is selectively diffused onto that portion of the P type layer 3 between the just formed N type semiconductor layers 4 and 5 and adjacent to the outer periphery of the N type layer 5 to form the highly doped P type semiconductor layer 10. For example, the diffusion of boron may be achieved through the use of BN (boron nitride) as the source of the impurity to be diffused, and the deposition is achieved at an temperature of 1,150° C for 90 minutes in an atmosphere of nitrogen gas, and the penetration is achieved at a temperature of 1,250° C for 60 minutes within an atmosphere of oxygen gas.

It is to be noted that the P-N junction 11 thus formed should have a surface impurity concentration of at least equal to or higher than $5 \times 10^{19}$ atoms/cm$^3$.

The P type layer 10 of the invention may be formed, for example, by the selective-diffusion method through the use of a photo resist applied on the $SiO_2$ film onto which a glass mask with a desired pattern is placed, thereby to enable the desired selective-diffusion.

When the semiconductor controlled rectifier shown in FIGS. 2 and 3 thus produced is connected to an unillustrated electrical source to be positively biased at the anode electrode 6 and the gate electrode 9 with respect to the cathode electrode 7, a gate current flows through an electrical path composed of the gate electrode 9 — the P type semiconductor layer 3 — the N type semiconductor layer 5 — the P type semiconductor layer 10 — the P type semiconductor layer 3 — the N type semiconductor layer 4 — the cathode electrode 7. Since electrons are injected from the N type semiconductor layer 5 due to the above gate current, a conducting current is allowed to flow through an electrical path composed of the P type emitter layer 2 — the N type base layer 1 — the P type base layer 3 — the N type second emitter layer 5 — the P type semiconductor layer 10 — the N type first emitter layer 4 — the cathode electrode 7, whereby the auxiliary thyristor is brought into the conductive state. In this connection it is to be noted that, since this current is higher than the gating current, the injection of the electrons from the N type semiconductor layer 4 is promoted. As a result, the main thyristor section, which is composed of the P type semiconductor layer 2 — the N type base layer 1 — the P type semiconductor layer 3 — the N type first emitter layer 4, is brought into its conductive state, whereby the firing operation of the thyristor is completed.

Since the semiconductor controlled rectifier of the invention is constructed as heretofore described, the device of the invention can be easily produced without the necessity of the metallic layer 8, which requires the step of a photoengraving process including mask aligning operation. This greatly simplifies the manufacturing process. In addition, this enables the realization of a semiconductor controlled rectifier improved in yield especially from the view point of the high *di/dt* capability.

When the cathode electrode is formed by the alloying method of metal, one evaporation process can be eliminated from the entire process, further simplifying the manufacturing process. In the present invention, the metalization process for bridging P type semiconductor layer 3 and second emitter layer 5 can be eliminated.

Figure 5:
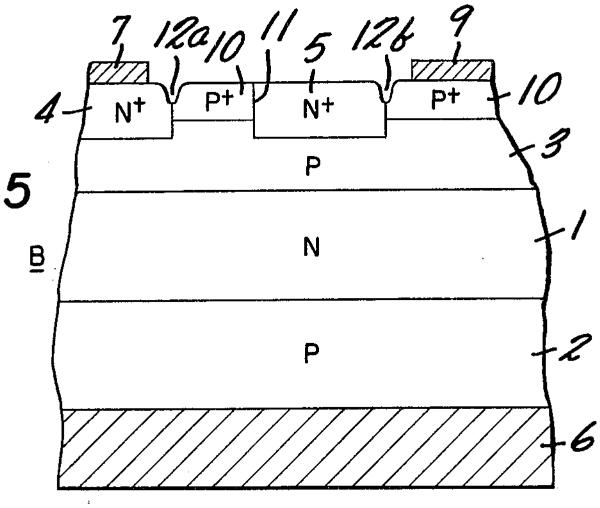
FIG. 5 is an enlarged fragmental sectional view for showing another embodiment of the present invention.

Referring now to FIG. 5, wherein another embodiment of the present invention is illustrated in an enlarged fragmental sectional view, it is seen that the semiconductor controlled rectifier generally designated by the reference character B is provided on its upper main surface with the P type semiconductor layer 10 which covers the entire surface of the P type semiconductor layer 3 except those portions of the N type layers 4 and 5. The P type semiconductor layer 10 of the embodiment shown in FIG. 5 is formed by diffusing boron of high concentration into the entire surface surrounded by first emitter layer of the semiconductor wafer B, while the layer 10 of FIGS. 2 and 3 is formed through selective-diffusion.

In order not to allow the gating current or the current flowing in the auxiliary thyristor to flow out only through the surfaces of the high concentration layers 5, 10 and 4, annular grooves 12*a* and 12*b* are formed by an etching process applied from the main surface at that portion of forward biased junctions between the layers 10 and 4, and between the layers 10 and 5 in the case when the electrode 9 is positively biased with respect to the electrode 7.

In other respects, the device of FIG. 5 is identical to that illustrated in FIGS. 2 and 3.

Such structure of the semiconductor device can eliminate one selective-diffusion process which requires a precise work and, therefore, the manufacturing process can be further simplified.

In order to further improve the *di/dt* capability that section of the wafer including the layers 5 and 10 may be subjected to the diffusion of gold, thereby to further reduce the reverse resistance across the P-N junction 11 formed between the layers 5 and 10. The diffusion of gold may be carried out at a temperature of from 780° C to 800° C for from 2 to 10 minutes so that the forward voltage drop $V_T$ of the wafer B does not become high and the forward and the reverse leakage currents do not become high.

With such structure of the semiconductor device of the invention, although the resistance of the layers 10 and 3 between the layers 4 and 5 increases with the increase in temperature of the device, the temperature dependency of the electrical resistance between the layers 4 and 5 is further improved as compared with that of the conventional device. This is because the resistance component of the P-N junction 11 formed between the layers 10 and 5 decreases in proportion to the increase in temperature. Thus, the device of the present invention can improve the dependency to temperature of the *di/dt* capability.

Although the invention has been described in terms of a semiconductor controlled rectifier of PNPN structure, it is easily understood that the invention is also applicable to another semiconductor device without departing from the spirit and the scope of the invention. For example, the invention is also applicable to a semiconductor controlled rectifier of the NPNP structure.

What we claim is:

1. A semiconductor controlled rectifier comprising a semiconductor wafer including a base layer of one semiconductivity type, a layer of the other semiconductivity type and a layer of said one semiconductivity type, said layer of the other conductivity type being between and forming a pn-junction with each of said layers of said one conductivity type, a control electrode disposed on said base layer of said semiconductor wafer, a first emitter layer of said other semiconductivity type forming a pn-junction with said base layer, a second emitter layer of said other semiconductivity type between said control electrode and said first emitter layer and forming a pn-junction with said base layer, and a layer of said one semiconductivity type between said first and second emitter layers and forming a pn-junction with said second emitter layer.

2. A semiconductor controlled rectifier as claimed in claim 1, wherein said layer of said one semiconductivity type between said first and second emitter layers and forming a pn-junction with said second emitter layer has an impurity concentration higher than that of said base layer.

3. A semiconductor controlled rectifier as claimed in claim 2, wherein said layer of said one semiconductivity type between said first and second emitter layers and forming a pn-junction with said second emitter layer has a surface impurity concentration equal to at least $5 \times 10^{19}$ atom/cm$^3$.

4. A semiconductor controlled rectifier as claimed in claim 1, wherein a section including said layer of said one semiconductivity type formed between said first and second emitter layers and forming a pn-junction with said second emitter layer and said second emitter layer have gold diffused therein.

* * * * *